(12) United States Patent
Lee et al.

(10) Patent No.: US 12,185,596 B2
(45) Date of Patent: Dec. 31, 2024

(54) DISPLAY DEVICE

(71) Applicant: LG Display Co., Ltd., Seoul (KR)

(72) Inventors: Saemleenuri Lee, Paju-si (KR); Dohong Kim, Paju-si (KR); Suhyeon Kim, Paju-si (KR); Seokwon Ji, Paju-si (KR); MoonSoo Kim, Paju-si (KR); Sungbin Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 17/553,735

(22) Filed: Dec. 16, 2021

(65) Prior Publication Data

US 2022/0208913 A1 Jun. 30, 2022

(30) Foreign Application Priority Data

Dec. 30, 2020 (KR) .......................... 10-2020-0188415
Nov. 12, 2021 (KR) .......................... 10-2021-0155907

(51) Int. Cl.
| | | |
|---|---|---|
| *H10K 59/124* | (2023.01) |
| *H10K 50/813* | (2023.01) |
| *H10K 50/822* | (2023.01) |
| *H10K 50/844* | (2023.01) |
| *H10K 59/131* | (2023.01) |
| H10K 50/818 | (2023.01) |
| H10K 50/828 | (2023.01) |

(52) U.S. Cl.
CPC ......... *H10K 59/124* (2023.02); *H10K 50/813* (2023.02); *H10K 50/822* (2023.02); *H10K 50/844* (2023.02); *H10K 59/131* (2023.02); H10K 50/818 (2023.02); H10K 50/828 (2023.02)

(58) Field of Classification Search
CPC .. H10K 59/124; H10K 59/131; H10K 59/122; H10K 50/813; H10K 50/822; H10K 50/844; H10K 50/818; H10K 50/828
See application file for complete search history.

(56) References Cited

U.S. PATENT DOCUMENTS

| 2010/0149143 A1* | 6/2010 | Yamamoto | ............. H10K 59/88 345/205 |
| 2014/0183479 A1* | 7/2014 | Park | ................... H10K 59/1315 438/34 |

(Continued)

FOREIGN PATENT DOCUMENTS

| KR | 10-2017-0063326 A | 6/2017 |
| KR | 10-2018-0003965 A | 1/2018 |
| KR | 20180047584 A | 5/2018 |

*Primary Examiner* — Sitaramarao S Yechuri
(74) *Attorney, Agent, or Firm* — Seed IP Law Group LLP

(57) ABSTRACT

A display device may prevent external moisture from being permeated thereinto. The display device comprises a substrate provided with a display area for displaying an image by a plurality of subpixels, a plurality of first electrodes provided in each of the plurality of subpixels over the substrate, a light emitting layer provided over the plurality of first electrodes, a second electrode provided over the light emitting layer, and a common power line provided between the substrate and the first electrodes, including a contact area to which the second electrode is connected. Each of the plurality of first electrodes is provided with a first opening area in an edge area adjacent to the contact area of the common power line.

26 Claims, 8 Drawing Sheets

(56) References Cited

U.S. PATENT DOCUMENTS

| | | | |
|---|---|---|---|
| 2015/0053955 A1* | 2/2015 | Furuie | H10K 59/124 |
| | | | 257/40 |
| 2015/0060816 A1* | 3/2015 | Matsumoto | H10K 59/123 |
| | | | 438/34 |
| 2016/0043341 A1* | 2/2016 | Heo | H10K 59/80522 |
| | | | 438/23 |
| 2016/0315133 A1* | 10/2016 | Sato | H10K 50/818 |
| 2017/0117337 A1* | 4/2017 | Kimura | H10K 50/805 |
| 2023/0189570 A1* | 6/2023 | Lin | H10K 71/00 |
| | | | 257/40 |

* cited by examiner

DISPLAY DEVICE

BACKGROUND

Technical Field

The present disclosure relates to a display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

An OLED device out of such display devices employs a spontaneous emission system, has a viewing angle, a contrast ratio, and the like which are more excellent than those of an LCD device, and can be decreased in weight and thickness and is advantageous in power consumption because a separate backlight is not required. An OLED device can be driven with a DC low voltage, has a high response speed, and has low manufacturing costs.

An organic light emitting display device has a drawback in that a light emitting element is easily degraded by external factors such as external moisture or oxygen.

BRIEF SUMMARY

The present disclosure has been made in view of various technical problems including the above problems, and various embodiments of the present disclosure provide a display device that may prevent external moisture from entering a light emitting element.

In addition to the technical benefits of the present disclosure as mentioned above, additional technical benefits and features of the present disclosure will be clearly understood by those skilled in the art from the following description of the present disclosure.

In accordance with an embodiment of the present disclosure, the above and other technical benefits can be accomplished by the provision of a display device comprising a substrate provided with a display area for displaying an image by a plurality of subpixels, a plurality of first electrodes provided in each of the plurality of subpixels over the substrate, a light emitting layer provided over the plurality of first electrodes, a second electrode provided over the light emitting layer, and a common power line provided between the substrate and the first electrodes, including a contact area to which the second electrode is connected. Each of the plurality of first electrodes is provided with a first opening area in an edge area adjacent to the contact area of the common power line.

In accordance with another embodiment of the present disclosure, the above and other technical benefits can be accomplished by the provision of a display device comprising a substrate provided with transmission areas and first, second, third and fourth light emission areas disposed between the transmissive areas, a light emitting element provided in each of the first, second, third and fourth light emission areas, including a first electrode, a light emitting layer and a second electrode, a common power line provided over the substrate, supplying a power source to the second electrode, a first undercut structure provided among the first, second, third and fourth light emission areas, exposing at least a portion of a common power line, and a second undercut structure provided between each of the first, second, third and fourth light emission areas and the first undercut structure. The light emitting layer and the second electrode are disconnected from each other by the second undercut structure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
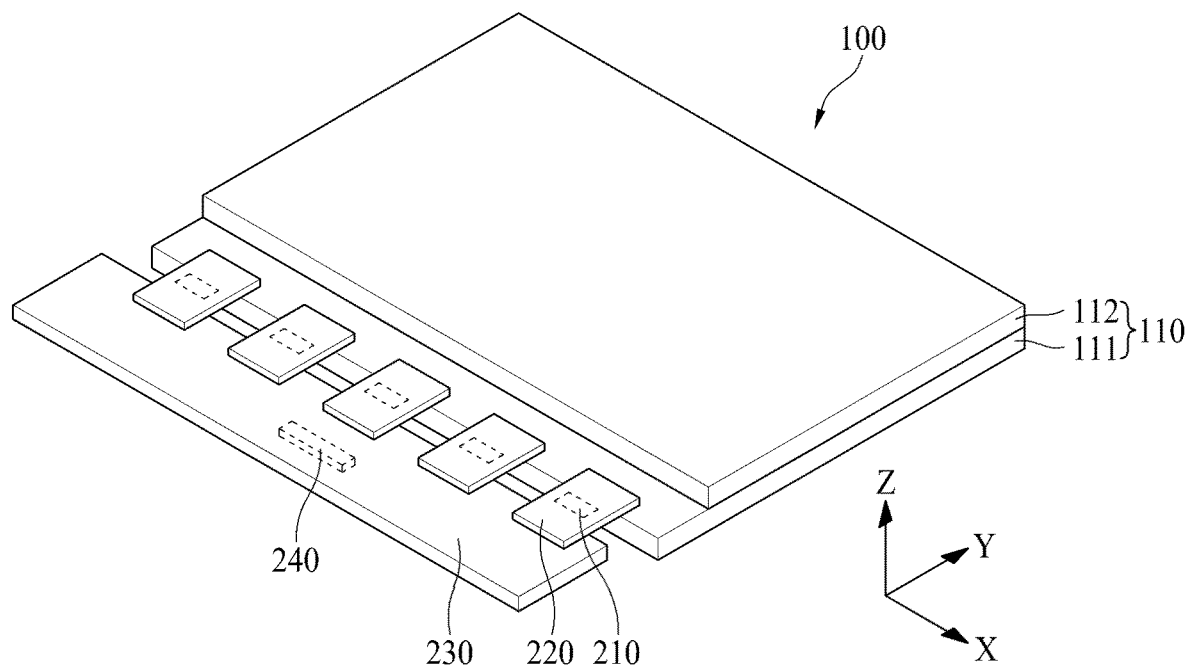
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the technical features of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,'

'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a display device according to the present disclosure will be described in detail with reference to the accompanying drawings. Wherever possible, the same reference numbers will be used throughout the drawings to refer to the same or like parts.

FIG. 1 is a perspective view illustrating a display device according to one embodiment of the present disclosure.

Hereinafter, X axis indicates a line parallel with a scan line, Y axis indicates a line parallel with a data line, and Z axis indicates a height direction of a display device 100.

Although a description has been described based on that the display device 100 according to one embodiment of the present disclosure is embodied as an organic light emitting display device, the display device 100 may be embodied as a liquid crystal display device, a plasma display panel (PDP), a Quantum dot Light Emitting Display (QLED) or an Electrophoresis display device.

Referring to FIG. 1, the display device 100 according to one embodiment of the present disclosure includes a display panel 110, a source drive integrated circuit (IC) 210, a flexible film 220, a circuit board 230, and a timing controller 240.

The display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the display panel 110, or the non-display area of both peripheral sides of the display panel 110 by a gate driver in panel (GIP) method. In another way, the scan driver may be manufactured in a driving chip, may be mounted on the flexible film, and may be attached to one peripheral side or both peripheral sides of the display area of the display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
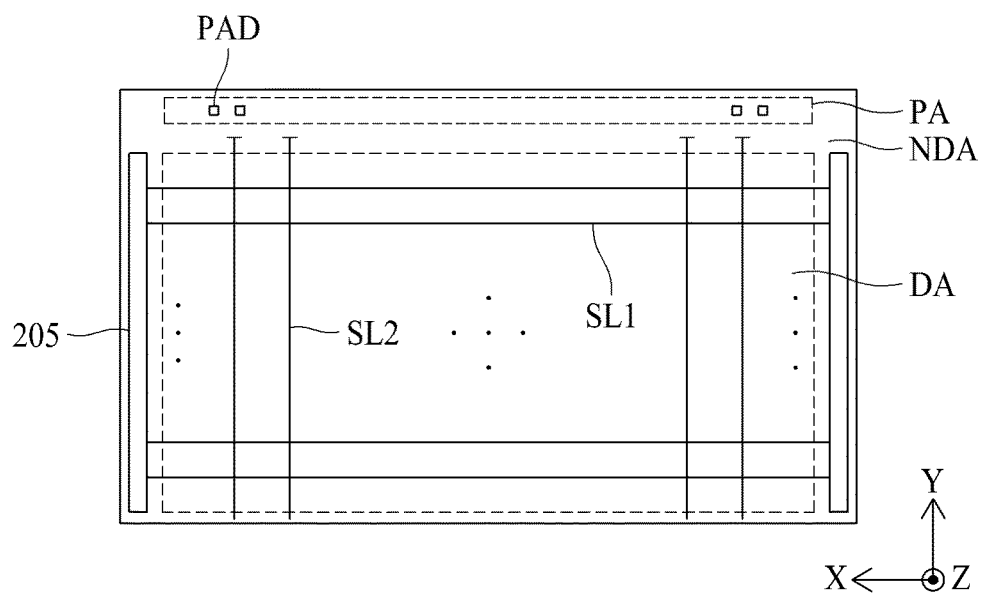
FIG. 2 is a schematic plane view illustrating a display panel according to one embodiment of the present disclosure.
Figure 3:
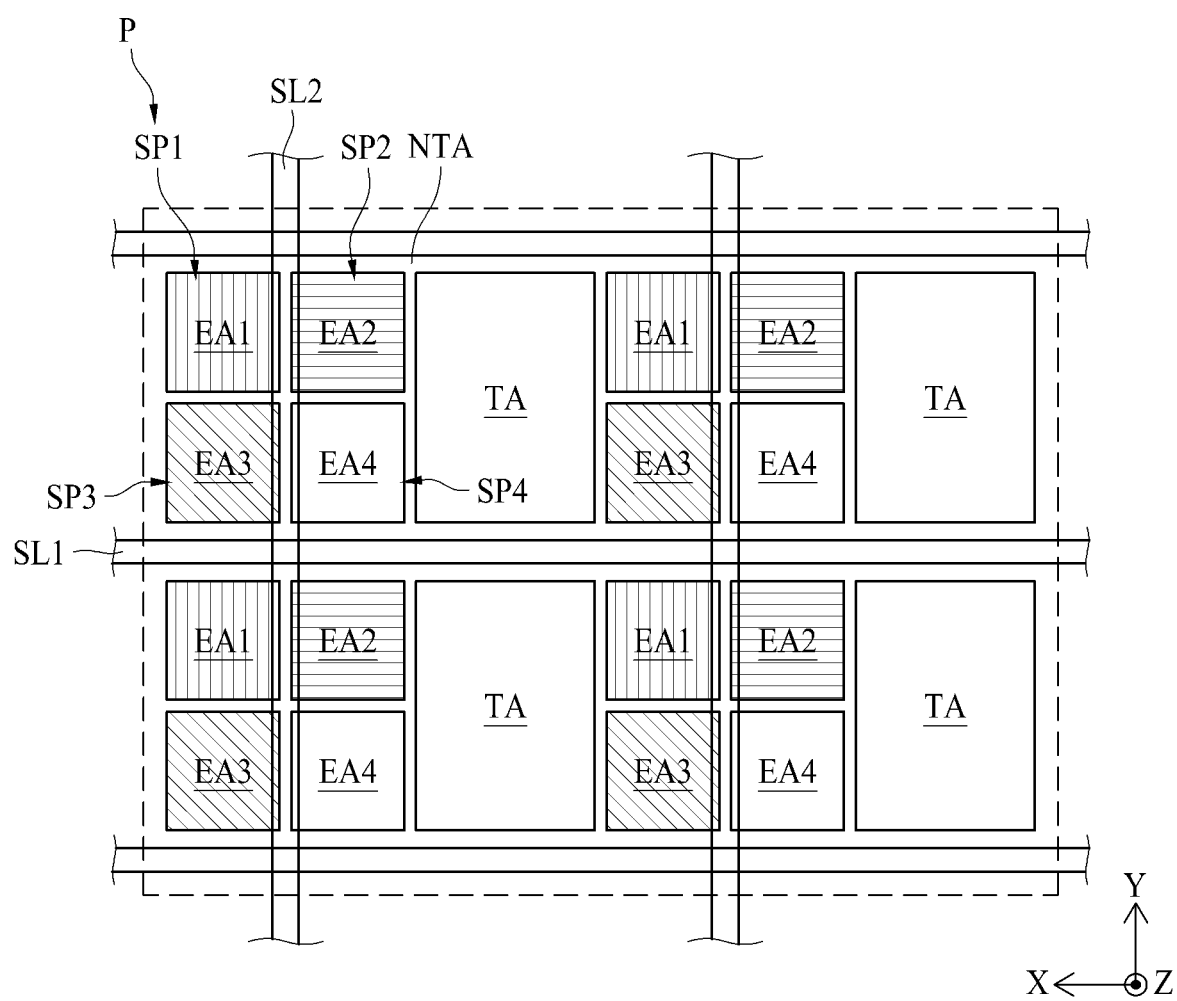
FIG. 3 is a view illustrating an example of a pixel provided in a display panel.
Figure 4:
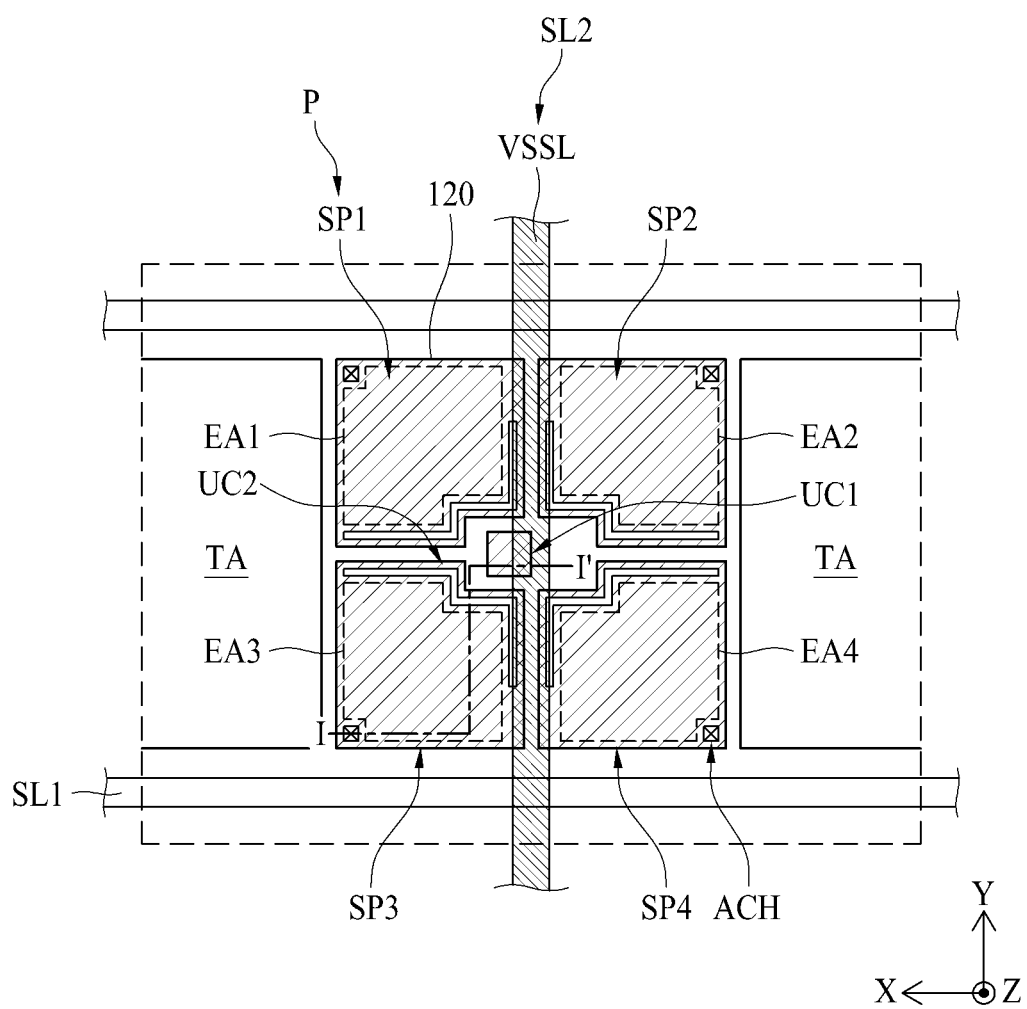
FIG. 4 is a view illustrating an example of a first undercut structure and a second undercut structure, which are provided in the pixel shown in FIG. 3.

FIG. 2 is a schematic plane view illustrating a display panel according to one embodiment of the present disclosure, and FIG. 3 is a view illustrating an example of a pixel provided in a display panel. FIG. 4 is a view illustrating an example of a first undercut structure and a second undercut structure, which are provided in the pixel shown in FIG. 3, and FIG. 5 is a cross-sectional view illustrating an example of line I-I' of FIG. 4.

In the following description, although the display panel 110 is embodied as a transparent display panel, the display panel 110 may be embodied as a general display panel in which a transmissive area TA is not provided.

Figure 5:
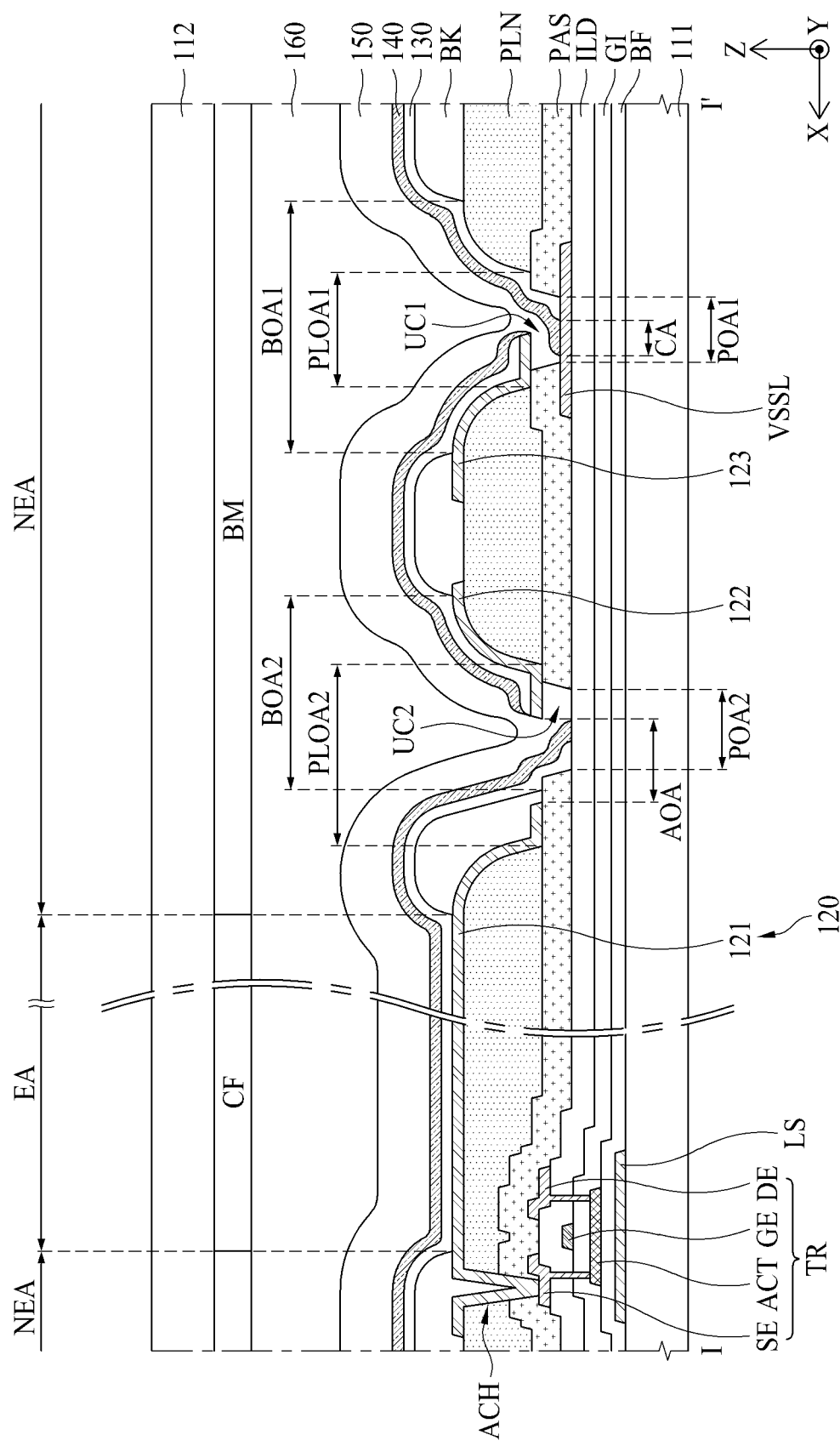
FIG. 5 is a cross-sectional view illustrating an example of line I-I' of FIG. 4.

Referring to FIG. 2 and FIG. 5, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 is connected to scan lines and supplies scan signals to the scan lines. The scan driver 205 may be disposed in one side of the display area DA of the display panel 110, or the non-display area NDA of both peripheral sides of the display panel 110 by a gate driver in panel (GIP) method. For example, as shown in FIG. 2, the scan driver 205 may be provided in both side of the display area DA of the display panel 110, but these scan drivers are not limited thereto. The scan driver 205 may be provided only in one side of the display area DA of the display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than β %, for example, about 50%. At this time, α is greater than β. A user may view an object or background arranged over a rear surface of the display panel 110 due to the transmissive area TA.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross the plurality of second signal lines SL2. Each of the plurality of first signal lines SL1 may include at least one scan line SCANL.

Hereinafter, when the first signal line SL1 includes a plurality of lines, one first signal line SL1 may refer to a signal line group including a plurality of lines. For example, one first signal line SL1 may refer to a signal line group including two scan lines SCANL.

The plurality of second signal lines SL2 may be extended in a second direction (e.g., Y-axis direction). Each of the plurality of second signal lines SL2 may include a common power line VSSL. Although not shown in detail, each of the plurality of second signal lines SL2 may further include at least one of at least one data line, a reference line or a pixel power line.

Hereinafter, when the second signal line SL2 includes a plurality of lines, one second signal line SL2 may refer to a signal line group including a plurality of lines. For example, one second signal line SL2 may refer to a signal line group including two data lines, a reference line, a pixel power line and a common power line VSSL.

A transmissive area TA may be disposed between adjacent first signal lines SL1. In addition, the transmissive area TA may be disposed between adjacent second signal lines SL2. As a result, the transmissive area TA may be surrounded by two first signal lines SL1 and two second signal lines SL2.

Pixels P may be provided to overlap at least one of the first signal line SL1 and the second signal line SL2, thereby emitting predetermined light or selected light to display an image. An emission area may correspond to an area, from which light is emitted, in the pixel P.

Each of the pixels P may include at least one of a first subpixel SP1, a second subpixel SP2, a third subpixel SP3 and a fourth subpixel SP4. The first subpixel SP1 may include a first emission area EA1 emitting light of a red color. The second subpixel SP2 may include a second emission area EA2 emitting light of a green color. The third subpixel SP3 may include a third emission area EA3 emitting light of a blue color. The fourth subpixel SP4 may include a fourth emission area EA4 emitting light of a white color. However, the emission areas are not limited to this example. Each of the pixels P may further include a subpixel emitting light of a color other than red, green, blue and white. Also, the arrangement order of the subpixels SP1, SP2, P3 and SP4 may be changed in various ways.

Hereinafter, for convenience of description, the description will be given based on that a first subpixel SP1 is a red subpixel emitting red light, a second subpixel SP2 is a green subpixel emitting green light, a third subpixel SP3 is a blue subpixel emitting blue light, and a fourth subpixel SP4 is a white subpixel emitting white light.

Each of the plurality of pixels P may be provided in a non-transmissive area NTA disposed between the transmissive areas TA. The plurality of pixels P may be disposed to be adjacent to each other in the non-transmissive area NTA in the second direction (e.g., Y-axis direction). For example, two of the plurality of pixels P may be disposed to be adjacent to each other in the non-transmissive area NTA with the first signal line SL1 interposed therebetween.

Each of the plurality of pixels P may include a first subpixel SP1, a second subpixel SP2 and a third subpixel SP3, and may further include a fourth subpixel SP4 in accordance with one embodiment. As shown in FIG. 3, each of the plurality of pixels P may include a first subpixel SP1, a second subpixel SP2, a third subpixel SP3 and a fourth subpixel SP4, which are disposed in a grid structure, but is not limited thereto. For example, each of the plurality of pixels P may include a first subpixel SP1, a second subpixel SP2, a third subpixel SP3 and a fourth subpixel SP4, which are disposed around a middle area. In this case, the middle area may indicate an area that includes a middle portion of each pixel P and has a predetermined size or selected size.

In detail, the first and second subpixels SP1 and SP2 may be disposed to be adjacent to each other based on the middle area of the pixel P in the first direction (e.g., X-axis direction), and the third and fourth subpixels SP3 and SP4 may be disposed to be adjacent to each other based on the middle area of the pixel P in the first direction (e.g., X-axis direction). One of the first and second subpixels SP1 and SP2 may be disposed to be adjacent to one of the third and fourth subpixels SP3 and SP4 in the second direction (e.g., Y-axis direction).

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor and a driving transistor TR.

In the display panel 110, the plurality of signal lines as well as the first subpixel SP1, the second subpixel SP2, the third subpixel SP3 and the fourth subpixel SP4 may be disposed in the non-transmissive area NTA except the transmissive area TA. Therefore, the first subpixel SP1, the second subpixel SP2, the third subpixel SP3 and the fourth subpixel SP4 may overlap at least one of the first signal line SL1 or the second signal line SL2.

As shown in FIG. 3, the first subpixel SP1, the second subpixel SP2, the third subpixel SP3 and the fourth subpixel SP4 may overlap at least a portion of the second signal line SL2 but do not overlap the first signal line SL1, the embodiment of the present disclosure is not limited thereto. In another embodiment, at least a portion of the first subpixel SP1, the second subpixel SP2, the third subpixel SP3 and the fourth subpixel SP4 may overlap the first signal line SL1.

The plurality of signal lines may include a first signal line SL1 extended in a first direction (e.g., X-axis direction) and a second signal line SL2 extended in a second direction (e.g., Y-axis direction) as described above.

The first signal line SL1 may include a scan line SCANL. The scan line SCANL may supply a scan signal to the subpixels SP1, SP2, SP3 and SP4 of the pixel P.

The second signal line SL2 may include a common power line VSSL, and may further include at least one of at least one data line, a reference line, or a pixel power line.

The reference line may supply a reference voltage (or an initialization voltage or a sensing voltage) to the driving transistor TR of each of the subpixels SP1, SP2, SP3 and SP4 provided in the display area DA.

Each of the at least one data line may supply a data voltage to at least one of the subpixels SP1, SP2, SP3 and SP4 provided in the display area DA. For example, the first data line may supply a first data voltage to the driving transistor TR of each of the first and third subpixels SP1 and SP3, and the second data line may supply a second data voltage to the driving transistor TR of each of the second and fourth subpixels SP2 and SP4.

The pixel power line may supply a first power source to the first electrode 120 of each of the subpixels SP1, SP2, SP3 and SP4. The common power line VSSL may supply a second power source to the second electrode 140 of each of the subpixels SP1, SP2, SP3 and SP4.

The switching transistor is switched in accordance with the scan signal supplied to the scan line to supply the data voltage supplied from the data line to the driving transistor TR.

The sensing transistor serves to sense a deviation in a threshold voltage of the driving transistor TR, which causes deterioration of image quality.

The driving transistor TR is switched in accordance with the data voltage supplied from the switching thin film transistor to generate a data current from a power source supplied from the pixel power line and supply the data current to the first electrode 120 of the subpixel. The driving transistor TR is provided for each of the subpixels SP1, SP2, SP3 and SP4, and includes an active layer ACT, a gate electrode GE, a source electrode SE and a drain electrode DE.

The capacitor serves to maintain the data voltage supplied to the driving transistor TR for one frame. The capacitor may include a first capacitor electrode and a second capacitor electrode, but is not limited thereto. In another embodiment, the capacitor may include three capacitor electrodes.

In detail, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, each of the plurality of signal lines, for example, the scan line, the data lines, reference line, pixel power line and common power line may be disposed on the same layer as any one of the light-shielding layer LS, the gate electrode GE, the source electrode SE and the drain electrode DE. For example, the common power line VSSL, as shown in FIG. 5, may be provided on the same layer as the source electrode SE and the drain electrode DE.

A passivation layer PAS for protecting the driving transistor TR may be provided over the source electrode SE and the drain electrode DE. A planarization layer PLN may be provided over the passivation layer PAS to planarize a step difference due to the driving transistor TR.

Light emitting elements comprised of a first electrode 120, a light emitting layer 130 and a cathode electrode 140, and a bank BK are provided over the planarization layer PLN.

The first electrode 120 may be provided over the planarization layer PLN and may be electrically connected to the driving transistor TR. In one embodiment, the first electrode 120 may be connected to the source electrode SE and the drain electrode DE of the driving transistor TR through the contact hole ACH passing through the planarization layer PLN and the passivation layer PAS.

The first electrode 120 may be provided for each of the subpixels SP1, SP2, SP3 and SP4. In detail, one first electrode 120 may be provided in the first subpixel SP1, another first electrode 120 may be provided in the second subpixel SP2, still another first electrode 120 may be provided in the third subpixel SP3, and further still another first electrode 120 may be provided in the fourth subpixel SP4. The first electrode 120 may be not provided in the transmissive area TA.

The first electrode 120 may be formed of a metal material having high reflectance, such as a deposited structure (Ti/Al/Ti) of Al and Ti, a deposited structure (ITO/Al/ITO) of Al and ITO, Ag alloy, a deposited structure (ITO/Ag alloy/ITO) of Ag alloy and ITO, MoTi alloy, and a deposited structure (ITO/MoTi alloy/ITO) of MoTi alloy and ITO. The Ag alloy may be an alloy of Ag, Pd, Cu, and the like. The MoTi alloy may be an alloy of Mo and Ti. The first electrode 120 may be anode electrode.

A bank BK may be provided over the planarization layer PLN. In addition, the bank BK may be provided between the first electrodes 120 provided in each of first, second, third and fourth subpixels SP1, SP2, SP3 and SP4, which may be referred to as "first to fourth subpixels SP1, SP2, SP3 and SP4." At this time, the bank BK may be provided to cover or at least partially cover edges of each of first electrodes 120 and expose a portion of each of first electrodes 120. Therefore, the bank BK may prevent light emission efficiency from being deteriorated due to a current concentrated on ends of each of first electrodes 120.

Meanwhile, the bank BK may be formed in a region substantially including light emission areas EA1, EA2, EA3 and EA4 of each of the subpixels SP1, SP2, SP3 and SP4. The light emission areas EA1, EA2, EA3 and E4 of each of the subpixels SP1, SP2, SP3 and SP4 indicate areas in which the first electrode 120, the organic light emitting layer 130 and the second electrode 140 are sequentially deposited so that holes from the first electrode 120 and electrons from the second electrode 140 are combined with each other in the organic light emitting layer 130 to emit light. In this case, the area in which the bank BK is provided does not emit light, and thus becomes a non-light emission area, and the areas in which the bank BK is not provided and the first electrodes 120 are exposed may be the light emission areas EA1, EA2, EA3 and EA4. The light emission areas EA1, EA2, EA3 and EA4 may be referred to as "first to fourth light emission areas EA1, EA2, EA3 and EA4."

The bank BK may be formed of an organic film such as an acrylic resin, an epoxy resin, a phenolic resin, a polyamide resin and a polyimide resin.

The organic light emitting layer 130 may be provided over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transport layer and the electron transport layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, in the organic light emitting layer 130, a light emitting layer may be provided for each of the subpixels SP1, SP2, SP3 and SP4. For example, a red light emitting layer for emitting red light may be provided in the first subpixel SP1, a green light emitting layer for emitting green light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

The second electrode 140 may be provided over the organic light emitting layer 130 and the bank BK. The second electrode 140 may also be provided in the transmissive area TA as well as the non-transmissive area NTA that includes a light emission area EA, but is not limited thereto. The second electrode 140 may be provided only in the non-transmissive area NTA that includes the light emission areas EA1, EA2, EA3 and EA4, and may not be provided in the transmissive area TA to improve transmittance.

The second electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a low resistance metal material such as silver (Ag) or an alloy of magnesium (Mg) and silver (Ag). The second electrode 140 may be cathode electrode.

An encapsulation layer 150 may be provided over the light emitting elements. The encapsulation layer 150 may be provided over the second electrode 140 to overlay the second electrode 140. The encapsulation layer 150 serves to prevent oxygen or moisture from being permeated into the organic light emitting layer 130 and the second electrode 140. To this end, the encapsulation layer 150 may include at least one inorganic film and at least one organic film.

Although not shown in FIG. 5, a capping layer may further be provided between the second electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer (not shown). The adhesive layer (not shown) may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter, a second color filter and a third color filter. The first color filter may be disposed to correspond to the light emission area EA1 of the first subpixel SP1, and may be a red color filter that transmits red light. The second color filter may be disposed to correspond to the light emission area EA2 of the second subpixel SP2, and may be a green color filter that transmits green light. The third color filter may be disposed to correspond to the light emission area EA3 of the third subpixel SP3, and may be a blue color filter that transmits blue light. In one embodiment, the color filter CF may further include a fourth color filter. The fourth color filter may be disposed to correspond to the light emission area EA4 of the fourth subpixel SP4, and may be a white color filter that transmits white light. The white color filter may be formed of a transparent organic material that transmits white light.

A black matrix BM may be provided between the color filters CF and between the color filter CF and the transmissive area TA. The black matrix BM may be disposed between the subpixels SP1, SP2, SP3 and SP4 to prevent color mixture between adjacent subpixels SP1, SP2, SP3 and SP4 from occurring.

In addition, the black matrix BM may be disposed between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs substantially all of the light in the visible wavelength range.

The display panel 110 described as above is characterized in that a first undercut structure UC1 and a second undercut structure UC2 are provided among the first to fourth subpixels SP1, SP2, SP3 and SP4.

The first undercut structure UC1 may be provided among the first to fourth subpixels SP1, SP2, SP3 and SP4. For example, the first undercut structure UC1 may be provided between the first electrodes 120 provided in each of the first to fourth subpixels SP1, SP2, SP3 and SP4. The first undercut structure UC1 may be provided among the first to fourth light emission areas EA1, EA2, EA3 and EA4. For example, the first undercut structure UC1 may be disposed in the middle of the first to fourth light emission areas EA1, EA2, EA3 and EA4.

The first undercut structure UC1 may expose at least a portion of the common power line VSSL among the first to fourth light emission areas EA1, EA2, EA3 and EA4. In detail, the first undercut structure UC1 may include a metal pattern 123 and at least one insulating film provided between the first electrode 120 and the substrate 111.

For example, the first undercut structure UC1 may include a passivation layer PAS and a metal pattern 123 provided over the passivation layer PAS. The passivation layer PAS may be provided over the common power line VSSL, and may be provided with a first passivation layer opening area POA1 that exposes at least a portion of the common power line VSSL. In addition, the planarization layer PLN may be provided over the passivation layer PAS, and may be provided with a first planarization layer opening area PLOA1 having a size wider than the first passivation layer opening area POA1 so that the first passivation layer opening area POA1 may be exposed.

The metal pattern 123 may be disposed on the same layer as the first electrode 120, and may be disposed to be spaced apart from the first electrode 120. The metal pattern 123 may be provided over the passivation layer PAS and the planarization layer PLN. At this time, the metal pattern 123 may be provided to cover at least a portion of the first passivation layer opening area POA1. That is, the metal pattern 123 may be protruded from the passivation layer PAS to the first passivation layer opening area POA1, and at least a portion thereof may overlap the first passivation layer opening area POA1. Therefore, the first undercut structure UC1 comprised of the metal pattern 123 and the passivation layer PAS may be formed. The portion of the metal pattern 123 that is protruded may be a protrusion, and may be referred to as "a protrusion." The metal pattern 123 may include the protrusion.

The first undercut structure UC1 may be provided on at least one side of the first passivation layer opening area POA1. For example, the first undercut structure UC1 may be provided on one side of the first passivation layer opening area POA1 as shown in FIGS. 4 and 5, but is not limited thereto. The first undercut structure UC1 may be provided on a plurality of sides of the first passivation layer opening area POA1.

Meanwhile, a bank BK may be provided over the metal pattern 123, and may be provided with a first bank opening area BOA1 having a size wider than the first passivation layer opening area POA1 so that the common power line VSSL may be exposed.

The organic light emitting layer 130 and the second electrode 140 may be disconnected by the first undercut structure UC1. The organic light emitting layer 130 may be disconnected from the end of the metal pattern 123 of the first undercut structure UC1. The organic light emitting layer 130 may be deposited over the common power line VSSL exposed by the first undercut structure UC1. At this time, the organic light emitting layer 130 may be disposed over only a portion of the common power line VSSL without fully covering the common power line VSSL exposed by the first undercut structure UC1. Thus, at least a portion of the common power line VSSL, for example, an area provided below the metal pattern 123 of the first undercut structure may still be exposed.

The second electrode 140 deposited over the organic light emitting layer 130 may also be disconnected at the end of the metal pattern 123 of the first undercut structure UC1. The second electrode 140 may be deposited over the common power line VSSL exposed by the first undercut structure UC1. Since the second electrode 140 has good step coverage, the second electrode 140 may be deposited with an area wider than the light emitting layer 130. Therefore, the second electrode 140 may be deposited over the common power line VSSL which is still exposed without being covered by the organic light emitting layer 130. As a result, the common power line VSSL may be provided with a contact area CA that is in contact with the second electrode 140 in the area exposed by the first undercut structure UC1, and may supply the second power source to the second electrode 140 in the contact area CA.

As described above, in the display panel 110 according to one embodiment of the present disclosure, the second electrode 140 may be connected to the common power line VSSL using the first undercut structure UC1. However, as shown in FIG. 5, an encapsulation layer 150 provided over the second electrode 140 may be formed to be thin in the first undercut structure UC1 due to a step difference of the first undercut structure UC1. Therefore, encapsulation performance of the encapsulation layer 150 may be reduced in an area overlapped with the first undercut structure UC1, and external moisture or oxygen is likely to be permeated into the encapsulation layer 150. In particular, external moisture or oxygen may easily be permeated into the encapsulation layer 150 through the organic light emitting layer 130 provided on the end of the metal pattern 123 of the first undercut structure UC1. In this case, the permeated moisture or oxygen may be transferred to the organic light emitting layer 130 provided in the light emission area EA along the organic light emitting layer 130. Therefore, the light emitting element may easily be degraded.

In the display panel 110 according to one embodiment of the present disclosure, the second electrode 140 may be formed to be in contact with a side portion of the metal pattern 123 while covering the organic light emitting layer 130 at the end of the metal pattern 123 of the first undercut structure UC1. Therefore, external moisture or oxygen may be prevented from being permeated into the organic light emitting layer 130 vulnerable to moisture. The second electrode 140 may be in contact with a side portion of the protrusion of the metal pattern 123.

Furthermore, the display panel 110 according to one embodiment of the present disclosure includes a second undercut structure UC2 to prevent moisture or oxygen permeated in the area overlapped with the first undercut structure UC1 from being transferred to the light emitting element.

The second undercut structure UC2 may be provided among the first to fourth subpixels SP1, SP2, SP3 and SP4, specifically between each of the first to fourth light emission areas EA1, EA2, EA3 and EA4 and the first undercut structure UC1. The second undercut structure UC2 may be provided in a plural number. For example, one second undercut structure UC2 may be provided between the first light emission area EA1 and the first undercut structure UC1, and another second undercut structure UC2 may be provided between the second light emission area EA2 and the first undercut structure UC1. Still another second undercut structure UC2 may be provided between the third light emission area EA3 and the first undercut structure UC1, and further still another second undercut structure UC2 may be provided between the fourth light emission area EA4 and the first undercut structure UC1.

In the display panel 110 according to one embodiment of the present disclosure, the second undercut structure UC2 may be provided in the first electrode 120 and at least partially overlap the first electrode 120. In the display panel 110 according to one embodiment of the present disclosure, a first opening area AOA may be formed in the first electrode 120 provided in each of the first to fourth subpixels SP1, SP2, SP3 and SP4 to form the second undercut structure UC2.

In detail, the first electrode 120 provided in each of the first to fourth subpixels SP1, SP2, SP3 and SP4 may include a first opening area AOA, a first electrode pattern 121 and a second electrode pattern 122, as shown in FIG. 5.

The first electrode 120 may be provided with a first opening area AOA in an edge area. For example, the first electrode 120 may be provided with a first opening area AOA in an edge area adjacent to the contact area CA of the common power line VSSL. The first electrode 120 may include a plurality of sides. The first electrode 120 may be provided with a first opening area AOA in an edge area of at least one side adjacent to the contact area CA of the common power line VSSL among the plurality of sides. The first opening area AOA of the first electrode 120 may be extended as much as a predetermined length or selected length along the edge area. For example, the first opening area AOA may be provided in a line shape along the edge area. The edge area may be partially or completely in a non-light emission area NEA shown in FIG. 5. For example, the first opening area AOA located in the edge area may be located in the non-light emission area NEA. The first opening area AOA may be an area over which the first electrode 120 is discontinuous (e.g., not present). Discontinuity of the first electrode 120 may be present in the first opening area AOA, which is in the edge area, which is in the non-light emission area NEA and adjacent to the contact area CA. "Adjacent" in this context may include configurations in which the first opening area AOA is laterally separated from the contact area CA by a non-zero distance, as shown in FIG. 5.

The first electrode pattern 121 may be disposed over a first side of the first opening area AOA, and may overlap a light emission area EA in which light is emitted from the organic light emitting layer 130. The first electrode pattern 121 may be connected to the source electrode SE or the drain electrode of the driving transistor TR through a contact hole ACH. An end of the first electrode pattern 121 may be covered or at least partially covered by the bank BK.

The second electrode pattern 122 may be disposed over a second side facing the first side of the first opening area AOA, and may overlap with a non-light emission area NEA in which light is not emitted from the organic light emitting layer 130. The second electrode pattern 122 is spaced apart from the first electrode pattern 121 with the first opening area AOA interposed therebetween, but may be connected with the first electrode pattern 121 at one end and the other end as shown in FIG. 4. Therefore, the second electrode pattern 122 may electrically be connected with the first electrode pattern 121.

In the display panel 110 according to one embodiment of the present disclosure, the second undercut structure UC2 may be formed using the second electrode pattern 122 of the first electrode 120, and the organic light emitting layer 130 and the second electrode 140 may be disconnected by the second undercut structure UC2.

In detail, the second undercut structure UC2 may include the second electrode pattern 122 of the first electrode 120, and at least one insulating film provided between the first electrode 120 and the substrate 111.

For example, the second undercut structure UC2 may include a passivation layer PAS and a second electrode pattern 122 provided over the passivation layer PAS. The passivation layer PAS may be provided with a second passivation layer opening area POA2 at least partially overlapping the first opening area AOA of the first electrode 120. In addition, the planarization layer PLN may be provided over the passivation layer PAS, and may be provided with a second planarization layer opening area PLOA2 having a size wider than the second passivation layer opening area POA2 so that the second passivation layer opening area POA2 may be exposed.

The second electrode pattern 122 may be provided over the passivation layer PAS and the planarization layer PLN. At this time, the second electrode pattern 122 may be provided over the passivation layer PAS to cover at least a portion of the second passivation layer opening area POA2. That is, the second electrode pattern 122 may be protruded from the passivation layer PAS to the second passivation layer opening area POA2, and at least a portion thereof may overlap the second passivation layer opening area POA2. Therefore, the second undercut structure UC2 comprised of the second electrode pattern 122 and the passivation layer PAS may be formed.

Meanwhile, the bank BK may be provided over the second electrode pattern 122, and may be provided with a second bank opening area BOA2 having a size wider than the second passivation layer opening area POA2 so that the second passivation layer opening area POA2 may be exposed. At this time, the bank BK may be disposed over the edge of the first electrode pattern 121 and at least a portion of the second electrode pattern 122.

The organic light emitting layer 130 and the second electrode 140 may be disconnected by the second undercut structure UC2. The organic light emitting layer 130 may be disconnected from the end of the second electrode pattern 122 of the second undercut structure UC2. Therefore, the organic light emitting layer 130 provided over the first electrode pattern 121 may be spaced apart from the organic light emitting layer 130 provided over the second electrode pattern 122.

In addition, the second electrode 140 deposited over the organic light emitting layer 130 may also be disconnected from the end of the second electrode pattern 122 of the second undercut structure UC2. Therefore, the second electrode 140 provided over the first electrode pattern 121 may be spaced apart from the second electrode 140 provided over the second electrode pattern 122.

As a result, the second undercut structure UC2 may disconnect the organic light emitting layer 130 from the second electrode 140 between each of the first to fourth light emission areas EA1, EA2, EA3 and EA4 and the first undercut structure UC1. Therefore, the display panel 110 according to one embodiment of the present disclosure may prevent moisture or oxygen permeated in the area overlapped with the first undercut structure UC1 from being transferred to the light emitting element.

In addition, the display panel 110 according to one embodiment of the present disclosure may make sure of an aperture ratio and increase light transmittance of the transmissive area as the contact area between the second electrode 140 and the common power line VSSL may be disposed among the plurality of subpixels SP1, SP2, SP3 and SP4 without being protruded to the transmissive area.

In FIGS. 4 and 5, the first undercut structure UC1 and the second undercut structure UC2 are formed using the metal patterns 122 and 123 provided on the same layer as the first electrode 120 of the light emitting element, but are not limited thereto. In the display panel 110 according to another embodiment, the first undercut structure UC1 and the second undercut structure UC2 may be formed using a plurality of insulating films provided between the first electrode 120 and the substrate 111. Hereinafter, the present disclosure will be described in detail with reference to FIGS. 6 and 7.

Figure 6:
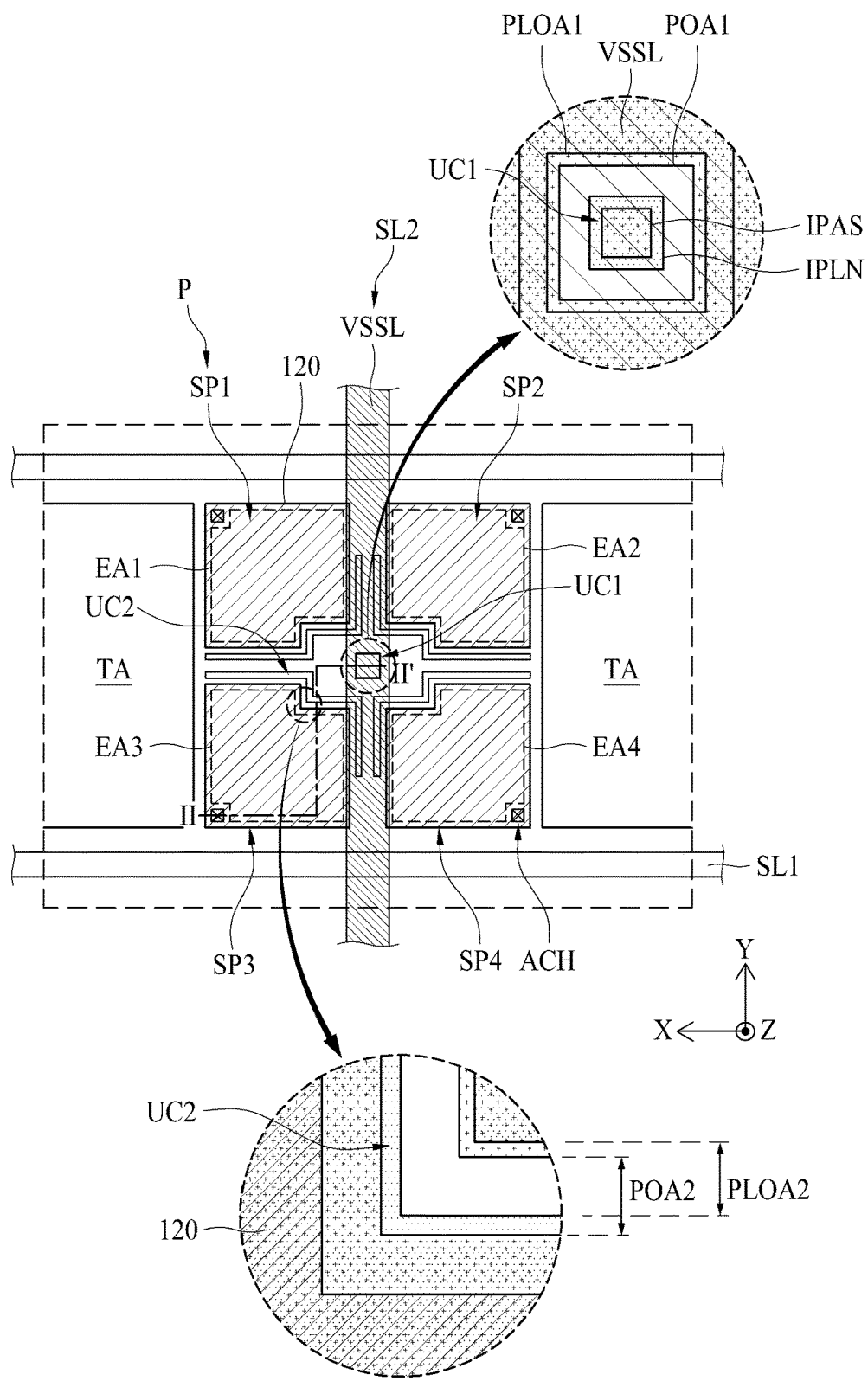
FIG. 6 is a view illustrating another example of a first undercut structure and a second undercut structure, which are provided in the pixel shown in FIG. 3.
Figure 7:
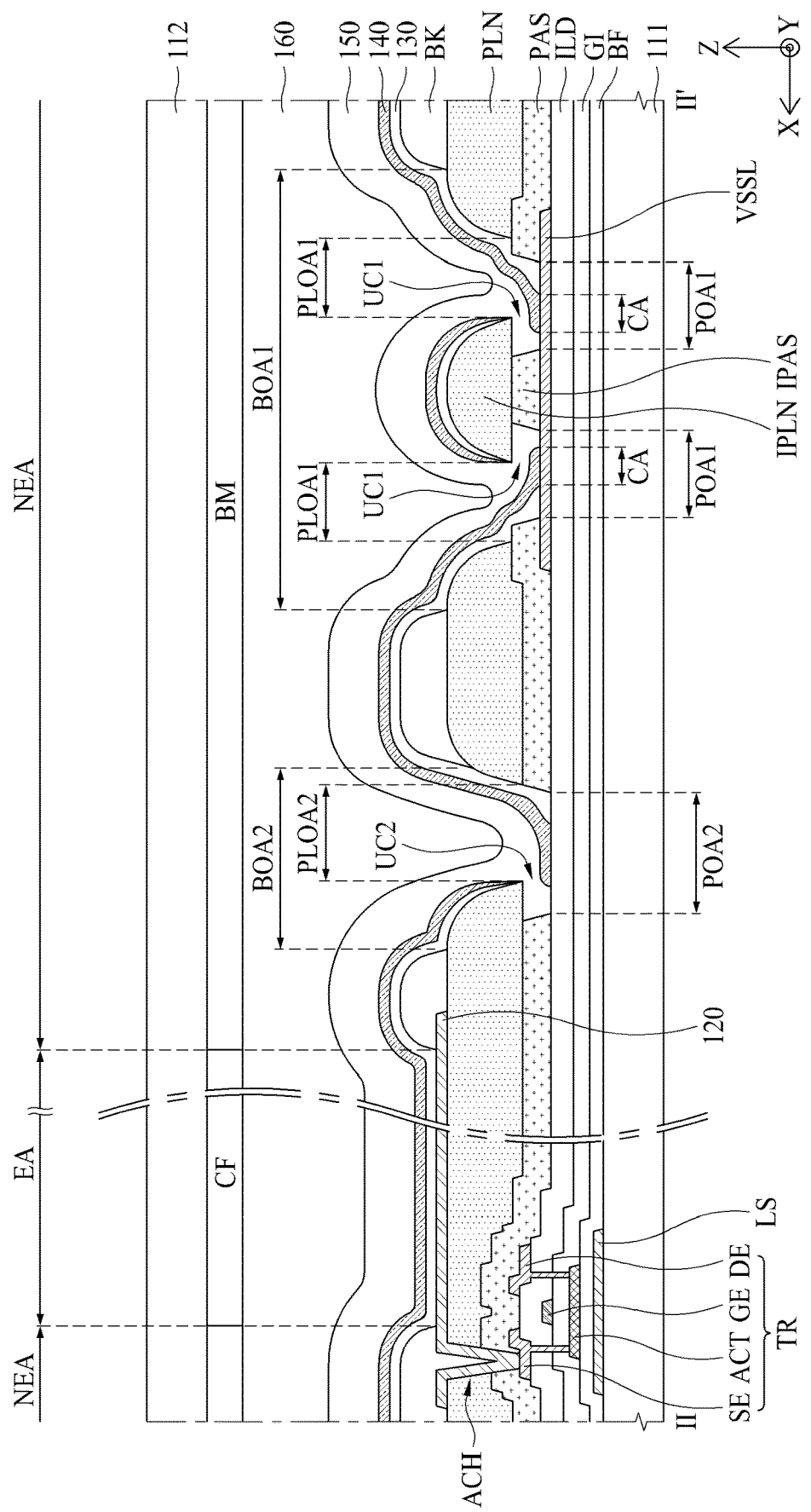
FIG. 7 is a cross-sectional view illustrating an example of line II-II' of FIG. 6.
Figure 8:
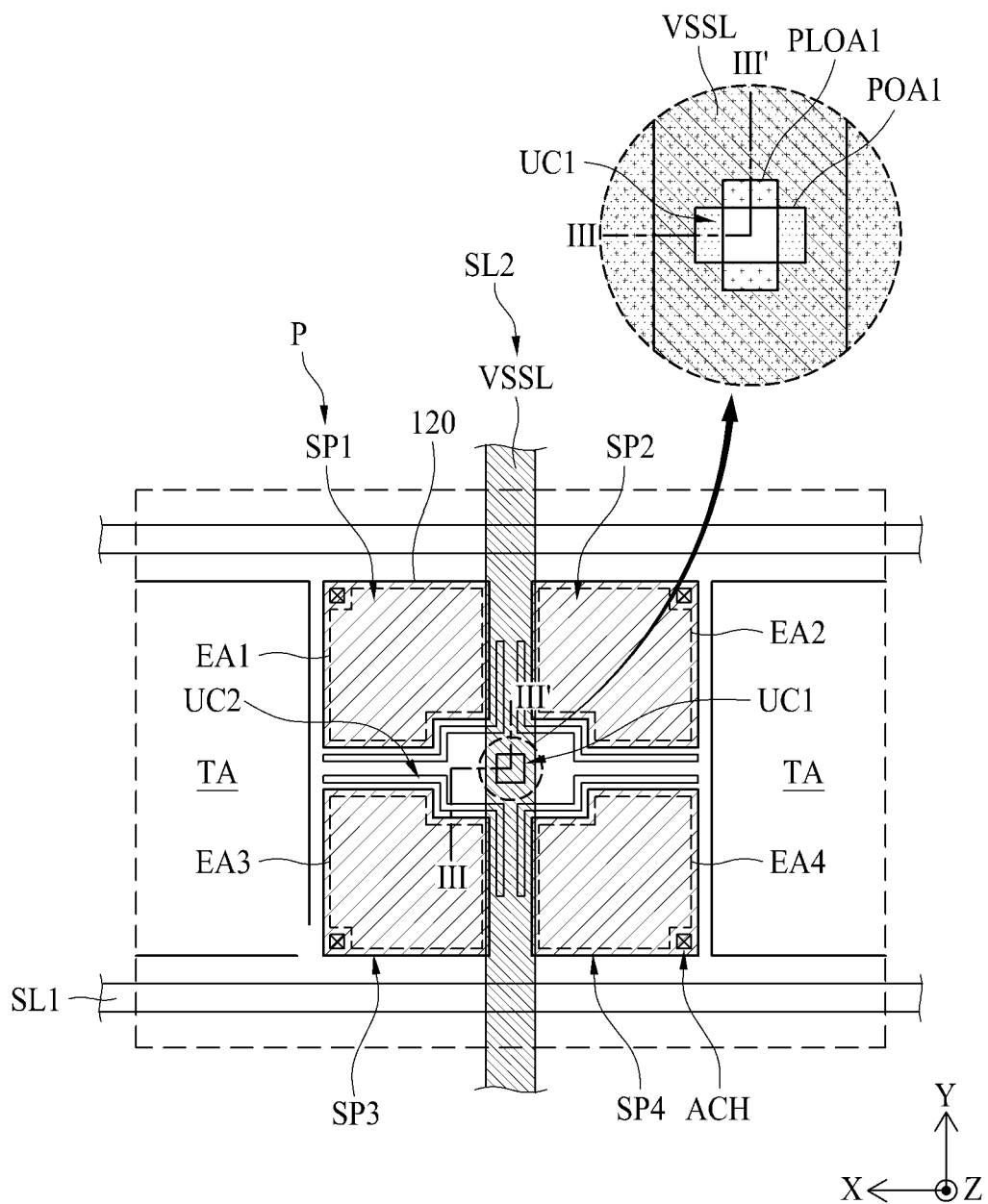
FIG. 8 is a view illustrating a modified example of FIG. 6.
Figure 9:
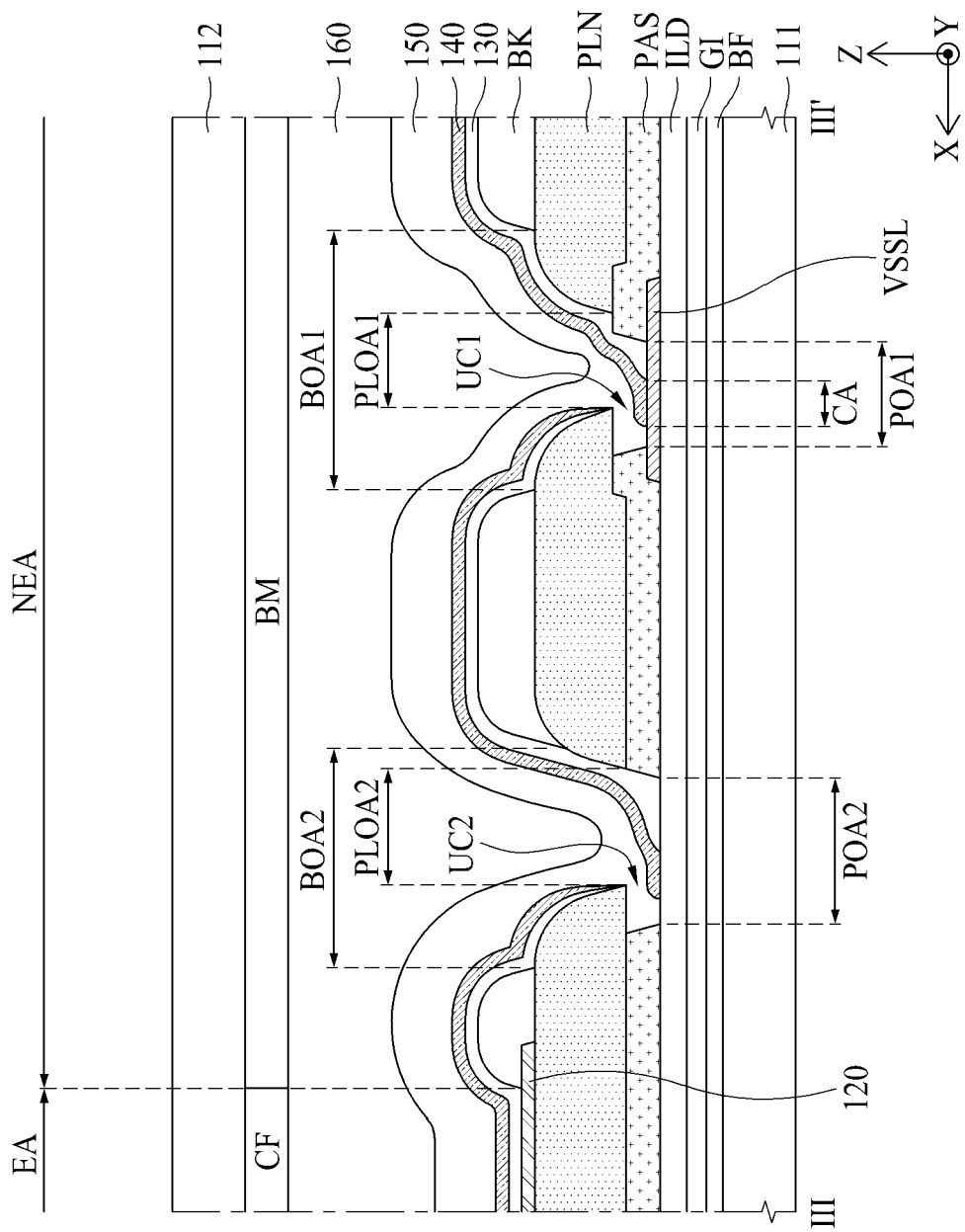
FIG. 9 is a cross-sectional view illustrating an example of line of FIG. 8.

FIG. 6 is a view illustrating another example of a first undercut structure and a second undercut structure, which are provided in the pixel shown in FIG. 3, and FIG. 7 is a cross-sectional view illustrating an example of line II-IF of FIG. 6. FIG. 8 is a view illustrating a modified example of FIG. 6, and FIG. 9 is a cross-sectional view illustrating an example of line of FIG. 8.

Referring to FIGS. 6 and 7, the first undercut structure UC1 may be provided among the first to fourth subpixels SP1, SP2, SP3 and SP4. For example, the first undercut structure UC1 may be provided between the first electrodes 120 respectively provided in the first to fourth subpixels SP1, SP2, SP3 and SP4. In addition, the first undercut structure UC1 may be provided among between the first to fourth light emission areas EA1, EA2, EA3 and EA4. For example, the first undercut structure UC1 may be disposed in the middle of the first to fourth light emission areas EA1, EA2, EA3 and EA4.

The first undercut structure UC1 may expose at least a portion of the common power line VSSL among the first to fourth light emission areas EA1, EA2, EA3 and EA4. In detail, the first undercut structure UC1 may include a plurality of insulating layers provided between the first electrode 120 and the substrate 111.

For example, the first undercut structure UC1 may include a passivation layer PAS and a planarization layer PLN provided between the passivation layer PAS and the first electrode 120. The passivation layer PAS may be provided over the common power line VSSL, and may be provided with a first passivation layer opening area POA1 that exposes at least a portion of the common power line VSSL. Also, the planarization layer PLN may be provided over the passivation layer PAS, and may be provided with a first planarization layer opening area PLOA1 overlapped with at least a portion of the first passivation layer opening area POA1.

As shown in FIG. 7, the planarization layer PLN may be protruded toward the first passivation layer opening area POA1 on the passivation layer PAS to at least partially overlap the first passivation layer opening area POA1. Therefore, at least a portion of the first passivation layer opening area POA1 is covered by the planarization layer PLN, whereby the first undercut structure UC1 comprised of the planarization layer PLN and the passivation layer PAS may be formed. As shown in FIG. 7, the planarization layer PLN extends past a sidewall of the passivation layer PAS in the X-axis direction. The first undercut structure UC1 may include, or may surround, the space surrounded by the sidewall of the passivation layer PAS, an upper surface of the common power line VSSL, and an underside of the protrusion of the planarization layer PLN that extends beyond the sidewall of the passivation layer PAS.

The first undercut structure UC1 may be provided on at least one side of the first passivation layer opening area POA1. For example, the first undercut structure UC1 may be provided on four sides of the first passivation layer opening area POA1 as shown in FIGS. 6 and 7. In this case, each of the first passivation layer opening area POA1 and the first planarization layer opening area PLOA1 may have a rectangular band shape having four outer sides forming a rectangular shape and four inner sides disposed inside four outer sides. The first undercut structure UC1 may be provided on the four inner sides of the first passivation layer opening area POA1 having a rectangular band shape.

In detail, the passivation layer PAS may be provided in an island pattern IPAS surrounded by the first passivation layer opening area POA1 on the common power line VSSL. The planarization layer PLN may be provided in an island pattern IPLN surrounded by the first planarization layer opening area PLOA1 on the island pattern IPAS of the passivation layer PAS. In order to form the first undercut structure UC1, the island pattern IPLN of the planarization layer PLN may be provided to have an area wider than that of the island pattern IPAS of the passivation layer PAS.

In FIGS. 6 and 7, the first undercut structure UC1 is provided on four sides of the first passivation layer opening area POA1, but is not limited thereto. In another embodiment, the first undercut structure UC1 may be provided on two sides of the first passivation layer opening area POA1 as shown in FIGS. 8 and 9. In this case, each of the first passivation layer opening area POA1 and the first planarization layer opening area PLOA1 may have a rectangular shape. The first undercut structure UC1 may be provided on a first side of the first passivation layer opening area POA1 and a second side facing the first side.

In detail, the planarization layer PLN may be formed to cover at least a portion of the first side of the first passivation layer opening area POA1, and may be formed to cover at least a portion of the second side of the first passivation layer opening area POA1.

At least a portion of the first planarization layer opening area PLOA1 may overlap the first passivation layer opening area POA1 and expose a portion of the common power line VSSL in an area overlapped with the first passivation layer opening area POA1.

Meanwhile, the bank BK may be provided on the planarization layer PLN, and may be provided with a first bank opening area BOA1 having an area wider than that of the first passivation layer opening area POA1 so that the common power line VSSL may be exposed.

The organic light emitting layer 130 and the second electrode 140 may be disconnected from each other by the first undercut structure UC1. The organic light emitting layer 130 may be disconnected at the end of the planarization layer PLN of the first undercut structure UC1. The organic light emitting layer 130 may be deposited on the common power line VSSL exposed by the first undercut structure UC1. At this time, the organic light emitting layer 130 may be deposited on only a portion of the common power line VSSL exposed by the first undercut structure UC1 without covering the entire common power line VSSL. Therefore, at least a portion of the common power line VSSL, for example, its area provided below the planarization layer PLN of the first undercut structure VSSL may still be exposed. It should be understood that "disconnected from each other" includes the meaning that the layer is rendered discontinuous by the first undercut structure UC1. For example, as shown in FIG. 7, the organic light emitting layer 130 is discontinuous due to the first undercut structure UC1, such that a portion of the organic light emitting layer 130 on the island pattern IPLN is physically separated from portions of the organic light emitting layer 130 on either side of the island pattern IPLN. Similarly, the second electrode 140 is discontinuous due to the first undercut structure UC1, such that a portion of the second electrode 140 on the island pattern IPLN is physically separated from portions of the organic light emitting layer 130 on the organic light emitting layer 130 on either side of the island pattern IPLN and underlying the island pattern IPLN.

The second electrode 140 deposited on the organic light emitting layer 130 may also be disconnected at the end of the planarization layer PLN of the first undercut structure UC1. The second electrode 140 may be deposited on the common power line VSSL exposed by the first undercut structure UC1. Since the second electrode 140 has good step coverage, the second electrode 140 may be deposited to be wider than the light emitting layer 130. Therefore, the second electrode 140 may be deposited on the common power line VSSL which is still exposed without being covered by the organic light emitting layer 130. As a result, the common power line VSSL may be provided with a contact area CA that is in contact with the second electrode 140 in the area exposed by the first undercut structure UC1, and may supply the second power source to the second electrode 140 in the contact area CA.

As described above, in the display panel 110 according to another embodiment of the present disclosure, the second electrode 140 may be connected to the common power line VSSL by using the first undercut structure UC1. However, as shown in FIGS. 7 and 9, the encapsulation layer 150 provided on the second electrode 140 may be formed to be thin in the first undercut structure UC1 due to a step difference of the first undercut structure UC1. Therefore, encapsulation performance of the encapsulation layer 150 may be reduced in an area overlapped with the first undercut structure UC1, and external moisture or oxygen may be likely to be permeated into the encapsulation layer 150. In particular, external moisture or oxygen may easily be permeated into the encapsulation layer 150 through the organic light emitting layer 130 provided on the end of the planarization layer PLN of the first undercut structure UC1. In this case, the permeated moisture or oxygen may be transferred to the organic light emitting layer 130 provided in the light emission area EA along the organic light emitting layer 130. Therefore, the light emitting element may easily be degraded.

In the display panel 110 according to another embodiment of the present disclosure, the second electrode 140 may be provided to be in contact with a side portion of the metal pattern 123 while covering the organic light emitting layer 130 at the end of the planarization layer PLN of the first undercut structure UC1. Therefore, external moisture or oxygen may be prevented from being permeated into the organic light emitting layer 130 vulnerable to moisture.

Furthermore, the display panel 110 according to another embodiment of the present disclosure includes a second undercut structure UC2 to prevent moisture or oxygen permeated in the area overlapped with the first undercut structure UC1 from being transferred to the light emitting element.

The second undercut structure UC2 may be provided among the first to fourth subpixels SP1, SP2, SP3 and SP4, specifically between each of the first to fourth light emission areas EA1, EA2, EA3 and EA4 and the first undercut structure UC1. The second undercut structure UC2 may be provided in a plural number. For example, one second undercut structure UC2 may be provided between the first light emission area EA1 and the first undercut structure UC1, and another second undercut structure UC2 may be provided between the second light emission area EA2 and the first undercut structure UC1. Still another second undercut structure UC2 may be provided between the third light emission area EA3 and the first undercut structure UC1, and further still another second undercut structure UC2 may be provided between the fourth light emission area EA4 and the first undercut structure UC1.

The display panel 110 according to another embodiment of the present disclosure may be provided between the first electrodes 120 respectively provided in the first to fourth subpixels SP1, SP2, SP3 and SP4. That is, in the display panel 110 according to another embodiment of the present disclosure, the second undercut structure UC2 may be provided outside the first electrode 120.

In detail, the second undercut structure UC2 may be disposed outside the first electrode 120. For example, the second undercut structure UC2 may be provided outside at least one side adjacent to the contact area CA of the common power line VSSL among the sides of the first electrode 120. The second undercut structure UC2 may be extended from the outside of at least one side of the first electrode 120 as much as a predetermined length along the edge of the first electrode 120. For example, the second undercut structure UC2 may be provided in a line or band shape along the edge of the first electrode 120.

In the display panel 110 according to another embodiment of the present disclosure, in order to form the second undercut structure UC2, a second passivation layer opening area POA2 and a second planarization layer opening area PLOA2 may be provided between the first electrode 120 provided in each of the first to fourth subpixels SP1, SP2, SP3 and SP4 and the first undercut structure UC1.

In detail, the second undercut structure UC2 may include a plurality of insulating layers provided between the first electrode 120 and the substrate 111.

For example, the second undercut structure UC2 may include a passivation layer PAS and a planarization layer PLN provided between the passivation layer PAS and the first electrode 120. The passivation layer PAS may include a second passivation layer opening area POA2 having a line or band shape along the edge of the first electrode 120. In addition, the planarization layer PLN may be provided with a second planarization layer opening area PLOA2 provided on the passivation layer PAS and overlapped with at least a portion of the second passivation layer opening area PO2.

As shown in FIG. 7, the planarization layer PLN may be protruded toward the second passivation layer opening area POA2 on the passivation layer PAS to overlap at least a portion of the second passivation layer opening area POA2. As a result, at least a portion of the second passivation layer opening area POA2 may be covered by the planarization layer PLN, whereby the second undercut structure UC2 comprised of the planarization layer PLN and the passivation layer PAS may be provided. As shown in FIG. 7, the planarization layer PLN extends past (e.g., overhangs) a sidewall of the passivation layer PAS at the second passivation layer opening area POA2. The second undercut structure UC2 may include, or may surround, the space surrounded by the sidewall of the passivation layer PAS, an upper surface of the interlayer dielectric layer ILD, and an underside of the protrusion of the planarization layer PLN that extends beyond the sidewall of the passivation layer PAS.

Meanwhile, the bank BK may be provided on the planarization layer PLN, and may be provided with a second bank opening area BOA2 having an area wider than that of each of the second passivation layer opening area POA2 and the second planarization layer opening area PLOA2 so that at least a portion of the second passivation layer opening area POA2 and the second planarization layer opening area PLOA2 may be exposed.

The organic light emitting layer 130 and the second electrode 140 may be disconnected from each other by the second undercut structure UC2. The organic light emitting layer 130 may be disconnected at the end of the planarization layer PLN of the second undercut structure UC2. The second electrode 140 deposited on the organic light emitting layer 130 may also be disconnected at the end of the planarization layer PLN of the second undercut structure UC2. Similar to described above with reference to the first undercut structure UC1, the organic light emitting layer 130 and the second electrode 140 may be rendered discontinuous by presence of the second undercut structure UC2.

As a result, the second undercut structure UC2 may disconnect the organic light emitting layer 130 and the second electrode 140 from each other between each of the first to fourth light emission areas EA1, EA2, EA3 and EA4 and the first undercut structure UC1. Therefore, the display panel 110 according to another embodiment of the present disclosure may prevent moisture or oxygen permeated in the area overlapped with the first undercut structure UC1 from being transferred to the light emitting element.

Also, the display panel 110 according to another embodiment of the present disclosure may make sure of an aperture ratio and increase light transmittance of the transmissive area as an area where the second electrode 140 is in contact with the common power line VSSL is disposed among the plurality of subpixels SP1, SP2, SP3 and SP4 without being protruded to the transmissive area.

In the display panel 110 according to another embodiment of the present disclosure, the first and second undercut structures UC1 and UC2 may be formed using only insulating layers instead of metal patterns. A minimum distance between the metal patterns may be varied depending on properties of metal. For example, in order to improve light efficiency, the first electrode 120 may be formed of a metal material that includes Ag having high reflectance. However, since Ag should maintain the minimum distance between the metal patterns at 14 um or more, it is difficult to form a fine pattern smaller than 14 um. For this reason, it may be difficult to form a first opening area AOA inside the first electrode 120 made of Ag as shown in FIGS. 5 and 6.

In addition, when the first and second undercut structures UC1 and UC2 are formed using the metal pattern, an end of the metal pattern may be sagged due to a weight when the metal pattern becomes thicker. Therefore, the first electrode 120 disposed on the same layer as the metal pattern may have a limitation in determining the thickness in consideration of light efficiency. Further, the metal pattern may cause arcing at the end during the manufacturing process to cause problems such as undercut burst.

In the display panel 110 according to another embodiment of the present disclosure, the first and second undercut structures UC1 and UC2 may be formed regardless of the material and thickness of the first electrode 120, and the undercut structure may stably be formed because arcing does not occur during the manufacturing process.

According to the present disclosure, the following advantageous effects may be obtained.

In present disclosure, the second undercut structure may be formed between the subpixels and the first undercut structure for connecting the second electrode to the common power line. The second electrode may be formed to be in contact with the side portion of the metal pattern while covering the organic light emitting layer at the end of the metal pattern having the first undercut structure. Therefore, the present disclosure may prevent external moisture or oxygen from being permeated into the organic light emitting layer vulnerable to moisture Also, the present disclosure may prevent moisture or oxygen permeated in the area overlapped with the first undercut structure from being transferred to the light emitting element by disconnecting the organic light emitting layer from the second electrode between the first undercut structure and the subpixels.

In addition, the present disclosure may make sure of an aperture ratio and increase light transmittance of the transmissive area as the contact area between the second electrode and the common power line is disposed among the plurality of subpixels without being protruded toward the transmissive area.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate provided with a display area, the display area configured to display an image by a plurality of subpixels;
a plurality of first electrodes provided in each of the plurality of subpixels, the plurality of first electrodes being over the substrate;
a light emitting layer provided over the plurality of first electrodes;
a second electrode provided over the light emitting layer; and
a common power line provided between the substrate and the first electrodes, the common power line including a contact area to which the second electrode is electrically connected,
wherein each of the plurality of first electrodes is provided with a first opening area in an edge area adjacent to the contact area of the common power line, and
wherein each of the plurality of first electrodes includes:
a first electrode pattern disposed over a first side of the first opening area, and
a second electrode pattern disposed over a second side of the first opening area, the second side facing the first side,
wherein the light emitting layer provided over the first electrode pattern is spaced apart from the light emitting layer provided over the second electrode pattern.

2. The display device of claim 1, wherein
the common power line includes an area at least partially exposed by a first undercut structure, and
the contact area contacts the second electrode in the area.

3. The display device of claim 2, further comprising:
a driving transistor provided between the substrate and the first electrode; and
a passivation layer provided between the driving transistor and the first electrode,
wherein the passivation layer includes a first passivation layer opening area exposing at least a portion of the common power line, and
the first undercut structure includes:
the passivation layer; and
a metal pattern disposed over the passivation layer, the metal pattern covering at least a portion of the first passivation layer opening area of the passivation layer.

4. The display device of claim 1, wherein each of the plurality of first electrodes includes a plurality of sides, and is provided with the first opening area in an edge area of at least one side adjacent to the contact area of the common power line among the plurality of sides.

5. The display device of claim 1, wherein the first opening area of each of the plurality of first electrodes is extended along the edge area.

6. The display device of claim 1, wherein the second electrode provided over the first electrode pattern is spaced apart from the second electrode provided over the second electrode pattern.

7. The display device of claim 1, wherein the first electrode pattern overlaps a light emission area in which light is emitted from the light emitting layer, and the second electrode pattern overlaps a non-light emission area.

8. The display device of claim 1, wherein the first electrode pattern and the second electrode pattern are electrically coupled with each other.

9. The display device of claim 1, wherein the second electrode pattern forms a second undercut structure with at least one insulating layer, the at least one insulating layer provided between the substrate and the first electrode.

10. The display device of claim 1, further comprising:
a driving transistor provided between the substrate and the first electrode; and
a passivation layer provided between the driving transistor and the first electrode,
wherein the passivation layer is provided with a second passivation layer opening area at least partially overlapping the first opening area of the first electrode, and
the second electrode pattern forms a second undercut structure, the second electrode pattern covering at least a portion of the second passivation layer opening area.

11. The display device of claim 10, wherein the first electrode pattern is coupled with the driving transistor through a contact hole.

12. The display device of claim 1, further comprising a bank provided over an edge of the first electrode pattern and the second electrode pattern, wherein the bank is provided with a bank opening area at least partially overlapping the first opening area.

13. A display device comprising:
a substrate provided with:
transmission areas; and
first, second, third and fourth light emission areas disposed between the transmissive areas;
a light emitting element provided in each of the first, second, third and fourth light emission areas, the light emitting element including:
a first electrode,
a light emitting layer, and
a second electrode;
a common power line provided over the substrate, the common power line configured to supply a power source to the second electrode;
a first undercut structure exposing at least a portion of the common power line; and
a second undercut structure provided between each of the first, second, third and fourth light emission areas and the first undercut structure,
wherein the light emitting layer and the second electrode are separated from each other by the second undercut structure, and
wherein the first electrode provided in each of the first, second, third and fourth light emission areas includes:
a first opening area;
a first electrode pattern disposed over a first side of the first opening area; and
a second electrode pattern disposed over a second side of the first opening area, the second side facing the first side.

14. The display device of claim 13, wherein the first undercut structure is disposed in the middle of the first, second, third and fourth light emission areas.

15. The display device of claim 13, wherein the second electrode is electrically connected to the common power line exposed by the first undercut structure.

16. The display device of claim 13, wherein the first undercut structure includes:
a metal pattern provided over the same layer as the first electrode; and
at least one insulating layer provided between the first electrode and the substrate.

17. The display device of claim 16, further comprising:
a driving transistor provided between the substrate and the first electrode; and
a passivation layer provided between the driving transistor and the first electrode,
wherein the passivation layer is provided with a first passivation layer opening area exposing at least a portion of the common power line, and
the first undercut structure includes:
the passivation layer; and
the metal pattern provided over the passivation layer, the metal pattern has a protrusion over the first passivation layer opening area, the protrusion covering at least a portion of the first passivation layer opening area.

18. The display device of claim 17, wherein the second electrode is in contact with a side portion of the protrusion.

19. The display device of claim 13, wherein the first electrode pattern overlaps each of the first, second, third and fourth light emission areas.

20. The display device of claim 13, wherein the first opening area is provided between each of the first, second, third and fourth light emission areas and the first undercut structure.

21. The display device of claim 13, wherein the second undercut structure includes at least one insulating layer provided between the substrate and the first electrode and the second electrode pattern.

22. The display device of claim 21, further comprising:
a driving transistor provided between the substrate and the first electrode; and
a passivation layer disposed between the driving transistor and the first electrode,
wherein the passivation layer is provided with a second passivation layer opening area at least partially overlapping the first opening area of the first electrode, and
the second undercut structure includes:
the passivation layer; and
the second electrode pattern provided over the passivation layer, the second electrode pattern covering at least a portion of the second passivation layer opening area.

23. The display device of claim 13, further comprising:
a bank provided over an edge of the first electrode pattern and the second electrode pattern, the bank being provided with a bank opening area at least partially overlapping the first opening area.

24. A display device comprising:
a substrate provided with:
transmission areas; and
first, second, third and fourth light emission areas disposed between the transmissive areas;
a light emitting element provided in each of the first, second, third and fourth light emission areas, the light emitting element including:

a first electrode,
a light emitting layer, and
a second electrode;
a common power line provided over the substrate, the common power line configured to supply a power source to the second electrode;
a first undercut structure exposing at least a portion of the common power line;
a second undercut structure provided between each of the first, second, third and fourth light emission areas and the first undercut structure;
a driving transistor provided between the substrate and the first electrode;
a passivation layer provided between the driving transistor and the first electrode; and
a planarization layer provided between the passivation layer and the first electrode,
wherein the light emitting layer and the second electrode are separated from each other by the second undercut structure,
wherein the passivation layer is provided with a first passivation layer opening area for exposing at least a portion of the common power line, and the planarization layer is provided with a first planarization layer opening area overlapped with at least a portion of the first passivation layer opening area, and
the first undercut structure includes the passivation layer and the planarization layer protruded toward the first passivation layer opening area of the passivation layer on the passivation layer to cover at least a portion of the first passivation layer opening area.

25. A display device comprising:
a substrate provided with:
  transmission areas; and
  first, second, third and fourth light emission areas disposed between the transmissive areas;
  a light emitting element provided in each of the first, second, third and fourth light emission areas, the light emitting element including:
    a first electrode,
    a light emitting layer, and
    a second electrode;
  a common power line provided over the substrate, the common power line configured to supply a power source to the second electrode;
  a first undercut structure exposing at least a portion of the common power line;
  a second undercut structure provided between each of the first, second, third and fourth light emission areas and the first undercut structure;
  a driving transistor provided between the substrate and the first electrode;
  a passivation layer disposed between the driving transistor and the first electrode; and
  a planarization layer disposed between the passivation layer and the first electrode,
  wherein the light emitting layer and the second electrode are separated from each other by the second undercut structure,
  wherein the passivation layer is provided with a second passivation layer opening area formed to be spaced apart from the first electrode, and the planarization layer is provided with a second planarization layer opening area overlapped with at least a portion of the second passivation layer opening area, and
  wherein the second undercut structure includes the passivation layer and the planarization layer protruded toward the second passivation layer opening area of the passivation layer on the passivation layer to cover at least a portion of the second passivation layer opening area.

26. The display device of claim 25, wherein the second passivation layer opening area and the second planarization layer opening area are extended along an edge of at least one side of the first electrode.

* * * * *